United States Patent [19]
Gantley

[11] 3,960,623
[45] June 1, 1976

[54] MEMBRANE MASK FOR SELECTIVE SEMICONDUCTOR ETCHING

[75] Inventor: Francis C. Gantley, Fulton, N.Y.

[73] Assignee: General Electric Company, Syracuse, N.Y.

[22] Filed: Mar. 14, 1974

[21] Appl. No.: 451,222

[52] U.S. Cl.................................. 156/16; 156/17; 156/212; 156/216; 156/247; 156/286; 156/344; 156/382; 156/475
[51] Int. Cl.²........................................ H01L 7/50
[58] Field of Search.............. 156/3, 10, 16, 17, 87, 156/212, 214, 216, 247, 285, 286, 344, 345, 382, 475, 479

[56] References Cited
UNITED STATES PATENTS

| | | | |
|---|---|---|---|
| 3,130,101 | 4/1964 | Gittins et al. | 156/285 X |
| 3,323,967 | 6/1967 | Webb | 156/345 |
| 3,371,001 | 2/1968 | Ettre | 156/3 X |
| 3,499,805 | 3/1970 | Brooks | 156/16 X |
| 3,519,506 | 7/1970 | Topas | 156/11 |

FOREIGN PATENTS OR APPLICATIONS 1,179,213   1/1970   United Kingdom.................. 156/10

*Primary Examiner*—William A. Powell
*Attorney, Agent, or Firm*—R. J. Mooney; D. E. Stoner

[57] ABSTRACT

Disclosed is a method for selectively etching portions of the surface of a semiconductor body. Selected regions of the surface which are not to be etched are covered with a pliable membrane such as a plastic sheet that conforms to the shape of the body and forms a seal with the body. The combination of the membrane and body is then exposed to an etchant which only contacts the exposed portions of the body. Conformity of the membrane can be enhanced by any of several methods.

For example, heat can be applied to make the membrane more pliable, a vacuum can be drawn between the membrane and the body or mechanical pressure can be applied to urge the membrane against the body. The aforementioned conformity enhancement steps are used during the covering operation, either individually or in combination.

9 Claims, 5 Drawing Figures

MEMBRANE MASK FOR SELECTIVE SEMICONDUCTOR ETCHING

BACKGROUND OF THE INVENTION

This invention relates to a method for use during manufacture of semiconductors and, more particularly, to a method for selectively etching portions of the surface of a semiconductor body.

In semiconductor device manufacture it is often necessary to selectively etch portions of a semiconductor body such as etching only one side of semiconductor wafer. For example, it may be desired to etch one side of a semiconductor wafer to reduce the thickness thereof following diffusion processes. A wafer thicker than is necessary for a given device is sometimes used during semiconductor device fabrication to insure sufficient mechanical integrity in the wafer to prevent breakage during fabrication. Another instance giving rise to a desire to etch only one side of a wafer occurs when one surface of a wafer is oxide covered during diffusion and it is later desirable to remove the oxide layer.

The most common prior art method of masking a wafer to facilitate etching only one side is to coat the opposite side (that is not to be etched) with Apiezon wax. The wax is applied to a liquid state mixed with a solvent vehicle. Following cure of the liquid wax, the waxed wafers are exposed to an etchant. Following the etching operation, the wax must be removed. As many as five to ten solvent and deionized water baths are frequently necessary to remove the wax. The wax masking method is therefore messy and, in addition, is not completely reliable inasmuch as spots of wax sufficient to spoil finished semiconductor devices frequently remain on portions of the semiconductor wafers. Furthermore, the cleaning process is wasteful of solvents, a point of particular importance in present times. Also, the process is very complex and requires many steps due, in part, to the substantial number of operations necessary to remove the wax from the wafer. Another disadvantage of the prior art method is that it is time consuming due to the involved cleaning steps and inasmuch as the liquid wax requires several hours to cure prior to etching.

It is, therefore, an object of this invention to provide an improved method for selectively masking bodies of semiconductor material that is less expensive and more reliable than the prior art methods such as wax masking.

Summary of the Invention

This invention is characterized by a method for selectively masking portions of a semiconductor body for etching operations. For example, a method of masking one surface of a semiconductor wafer so that the opposite surface can be etched is fully discussed below. A pliable membrane, such as a plastic sheet, is utilized to cover the portion of the wafer that is not to be etched. The pliable membrane conforms to the shape of the wafer and forms a seal therewith. After the covering operation, the wafer is exposed to an etchant.

It has been found that the subject method provides higher device yield than the prior art wax masking method. This is so because a substantial portion of devices were previously lost due to wax residue. When employing the present method, the membrane is removed in one piece and thus no residue remains. The subject method is considerably less expensive than the wax masking method inasmuch as the membrane is inexpensive and the equipment necessary to practice the method (to be described below) is also inexpensive. Furthermore, no solvent is used. The method is convenient to carry out inasmuch as there is no wax curing step and, since no liquid other than the necessary etchant is involved, the subject method is neat, an important attribute in semiconductor processing.

The reliability of the subject method can be improved by enhancing the conformity of the membrane to the semiconductor body and thus enhancing the seal between the body and the membrane. Several methods that can be used to improve the conformity and seal, either individually or in combination, are disclosed below. The methods include applying mechanical pressure to the membrane, as for example by rolling the membrane with a resilient roller to urge it against the semiconductor body. Other methods for improving the conformity include drawing a vacuum between the semiconductor body and the membrane and heating the membrane to render it more pliable. It will be realized that the aforementioned steps for improving the reliability of the subject method are also inexpensive and utilize equipment that is conventional and frequently in the possession of semiconductor manufacturers.

DESCRIPTION OF THE DRAWINGS

These and other features and objects of the present invention will become more apparent upon a perusal of the following description taken in conjunction with the accompanying drawings wherein.

DESCRIPTION OF THE PREFERRED METHOD

Figure 1:
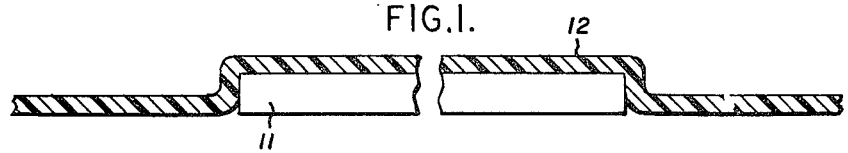
FIG. 1 is a sectional view of a portion of a semiconductor body with a pliable membrane sealingly conformed thereto.

Referring first to FIG. 1 there is shown a body of semiconductor material 11 that is covered by a pliable membrane 12 which sealingly conforms thereto. The body 11 of semiconductor material can be, for example, a wafer of monocrystalline silicon. Assume, for example, that it is desired to etch one side of the wafer 11.

The membrane 12 is preferably a pliable sheet of plastic such as, for example, polyvinyl chloride. In choosing the thickness of the membrane 12 it must be kept in mind that thicker sheets are more difficult to make conform. The most practical thickness range for the sheet has been found to be from approximately 1/10 of a mil in thickness up to about four mils thick. It is anticipated that sheets both thicker and thinner than the aforementioned range will be useful for certain configurations of semiconductor bodies.

Figure 2:
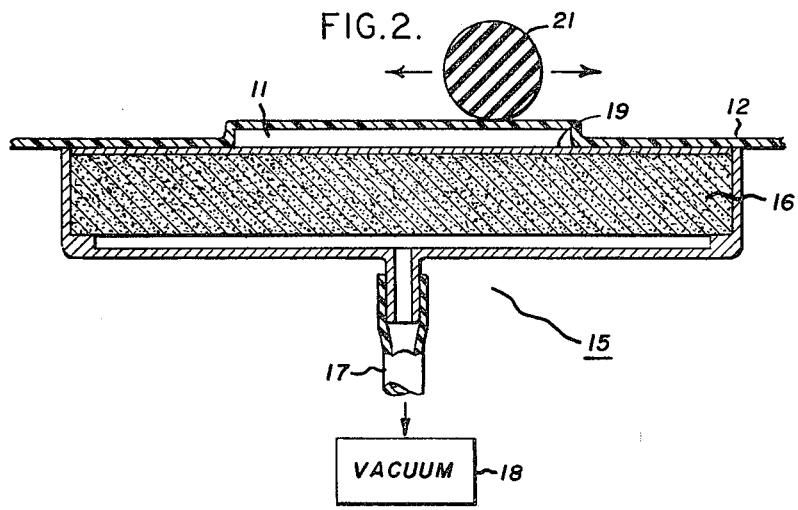
FIG. 2 is an elevational diagramatic view of apparatus suitable for applying a membrane to a body such as was depicted in FIG. 1.

Referring now to FIG. 2 there is shown a portion of an apparatus 15 suitable to sealingly apply the membrane 12 to the portion of the wafer surface that is not to be etched. In a vacuum chuck, a body of porous material 16 is pneumatically coupled to a vacuum line 17 that is connected to a source of vacuum 18. Any conventional system (not illustrated) can be utilized to control the source of vacuum 18. To cover the wafer 11 with the membrane 12, the wafer is first placed on the porous material 16 with the side of the wafer to be etched against the vacuum chuck. If desired, an intermediate porous pad such as a sheet of filter paper 19 can be disposed between the wafer 11 and the porous material 16. For example, the filter paper 19 may be desirable if it is felt that the porous material 16 may undesirably scratch the surface of the wafer 11. Next, the membrane 12 is placed so as to cover the wafer 11 and the surrounding portion of the porous material.

After the membrane 12 is put into position, the source of vacuum 18 is activated such that a vacuum is drawn which extends between the membrane and the upper side of the wafer 11. Depending on the shape of the wafer 11 and the thickness and pliability of the membrane 12, the vacuum alone may be sufficient to cause the membrane to adhere and seal to the wafer. However, a desirable step to assure a good seal of the membrane to the wafer is to apply mechanical pressure to the side of the membrane opposite the wafer. For example, a resilient roller 21 (diagrammatically illustrated) can be reciprocally moved across the membrane 12 to remove trapped gas bubbles from between the wafer 11 and the membrane.

Figure 3:
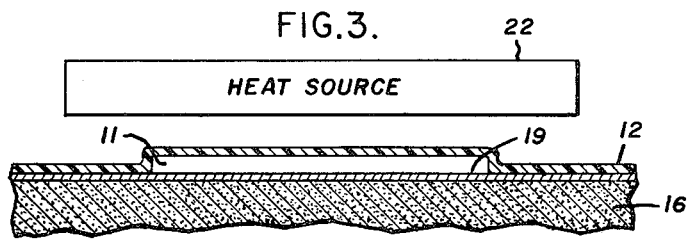
FIGS. 3 and 4 depict optional added steps that can be employed to improve the conformity of the membrane to the semiconductor body if desired.
Figure 4:
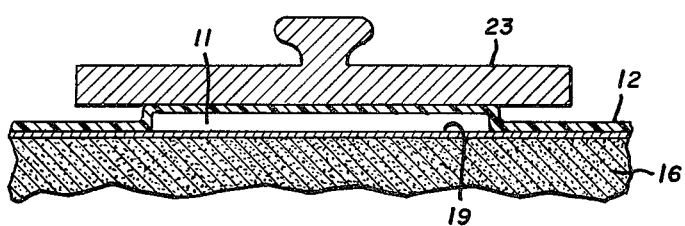

If further assurance that the membrane 12 will conform to the wafer 11 is desired, the steps depicted in FIGS. 3 and 4 can be followed. A selectively operable heat source 22 is moved to a position over the wafer 11 and membrane 12 as shown in FIG. 3. The heat source is activated and warms the membrane 12 to increase its pliability. During this time, the source of vacuum 18 preferably remains activated.

Following the heating operation, the membrane 12 is preferably cooled prior to the release of the vacuum. A particularly effective way of cooling the membrane 12 has been found to store a metal quenching plate 23 in a cool place as, for example, in water, and to put the plate over the membrane 12 as shown in FIG. 4 after the removal of the heater 22. When the membrane 12 is sufficiently cooled, the plate 23 is removed to its storage place, the source of vacuum 18 is turned off and the combination of the wafer 11 and membrane 12 is removed from the apparatus 15.

The combination of the wafer 11 and membrane 12 is next exposed to an etchant, as for example, by immersion. In the choice of an etchant and a particular etching process a few constraints should be considered. The temperature of the etchant should be low enough that the pliable membrane 12 is not softened sufficiently to destroy the seal. Furthermore, the membrane 12 should be unaffected by the etchant. A combination that has been found extremely effective to etch silicon wafers on one side comprises covering the opposite wafer side with a sheet of polyvinyl chloride of a thickness from 2 to 4 mils. When etching the silicon with a PVC membrane, hydrofluoric acid has been found an effective etchant. If the silicon to be etched is doped to be of the "P" type, it has been found that dimetch (hydrofluoric acid, nitric acid, iodine and acetic acid) works effectively.

Following the etching operation, the membrane 12 must be removed from the body 11. An effective removal method has been found to be as follows.

Figure 5:
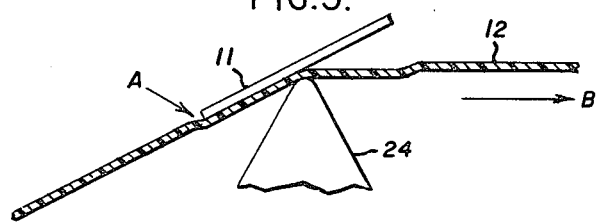
FIG. 5 illustrates a preferred method for removing the membrane from the semiconductor body following the etching treatment.

The membrane 12 is grasped on each end and put under a slight tension such that the seal around the periphery of the body 11 begins to break as illustrated at Point "A" in FIG. 5. The membrane, still under slight tension, is then pulled across an edge 24 as illustrated in FIG. 5. The motion is in the direction of the arrow "B" in FIG. 5. As shown, the adhesion seal between the membrane 12 and the wafer 11 is broken as the membrane 12 passes across the edge 24.

Consequently, it will be appreciated that there has been disclosed an effective method of selectively etching portions of a semiconductor bodies that is inexpensive, reliable and produces high yields.

It will be further realized that the subject method constitutes a very efficient way to remove oxide from only one side of a wafer in order to present that one side, in an oxide free state, for contact metallization. When etching oxide, hydrofluoric acid is an effective etchant.

In light of the foregoing, many modifications and variations of the present invention will be obvious to those skilled in the art. For example, membranes and etchants other than those specifically mentioned above will be found useful. Or, semiconductor bodies of other shapes can be masked. Furthermore, it has been found convenient to place several wafers on a vacuum chuck and simultaneously adhere them to a single membrane and etch them together. It will be appreciated, therefore, that the true scope of the invention is only as defined by the following claims:

What is claimed is:

1. Method of selectively etching wafers of semiconductor material, said method comprising the steps of:
    supplying a wafer of semiconductor material, wherein one side of said wafer is not to be etched;
    covering said side and at least a part of the peripheral edge therearound with a sheet of pliable plastic membrane such that said membrane conforms to the shape of said side and part of said edge and forms a seal therewith and said membrane does not contact the side of said wafer opposite said one side, said step of covering comprising the substeps of:
    placing said membrane on said one side;
    heating said membrane to enhance conformity and drawing a vacuum between said membrane and said wafer;
    applying mechanical pressure to said membrane to further promote uniformity; and
    cooling said membrane; and
    exposing the combination of said wafer and said membrane to an etchant so that said wafer, where exposed, is etched and said side of said wafer is not etched, and wherein said membrane and said etchant are selected so that said membrane is nonreactive with said etchant.

2. A method according to claim 1 wherein said applying mechanical pressure step comprises urging said membrane against said wafer with a resilient roller to remove trapped gas bubbles.

3. A method according to claim 1 comprising, following said exposing step, the step of separating said wafer from said membrane by drawing said membrane over an edge, with said edge contacting the side of said membrane opposite said wafer.

4. A method according to claim 1 wherein said membrane is of a thickness of approximately 0.1 mil to 4 mils.

5. A method according to claim 9 wherein said wafer is silicon that is at least partially covered with silicon oxide and said etchant comprises hydrofluoric acid.

6. A method according to claim 1 wherein said wafer is silicon and said etchant comprises nitric acid, iodine, hydrofluoric acid and acetic acid.

7. A method according to claim 1 wherein said step of exposing comprises immersing said combination in said etchant.

8. A method according to claim 1 wherein said covering step comprises placing said wafer on a piece of porous material on a vacuum chuck so that said side is not in contact with said porous material and then placing said membrane over said wafer.

9. A method according to claim 8 wherein said porous material comprises filter paper.

* * * * *

UNITED STATES PATENT AND TRADEMARK OFFICE
CERTIFICATE OF CORRECTION

PATENT NO. : 3,960,623
DATED : June 1, 1976
INVENTOR(S) : Francis C. Gantley

It is certified that error appears in the above-identified patent and that said Letters Patent are hereby corrected as shown below:

Column 5, Claim 5, line 1: Claim reference numeral "9" should read -- 1 --.

*Signed and Sealed this*

Seventeenth *Day of* August 1976

[SEAL]

*Attest:*

RUTH C. MASON
*Attesting Officer*

C. MARSHALL DANN
*Commissioner of Patents and Trademarks*